(12) United States Patent
Noble, Jr. et al.

(10) Patent No.: US 7,105,386 B2
(45) Date of Patent: Sep. 12, 2006

(54) HIGH DENSITY SRAM CELL WITH LATCHED VERTICAL TRANSISTORS

(75) Inventors: Wendell P. Noble, Jr., Milton, VT (US); Leonard Forbes, Corvallis, OR (US)

(73) Assignee: Micron Technology, Inc., Boise, ID (US)

( * ) Notice: Subject to any disclaimer, the term of this patent is extended or adjusted under 35 U.S.C. 154(b) by 9 days.

(21) Appl. No.: 10/795,516

(22) Filed: Mar. 9, 2004

(65) Prior Publication Data

US 2004/0171219 A1    Sep. 2, 2004

Related U.S. Application Data

(62) Division of application No. 09/750,111, filed on Dec. 29, 2000, now Pat. No. 6,936,886, which is a division of application No. 09/076,728, filed on May 13, 1998, now Pat. No. 6,225,165.

(51) Int. Cl.
*H01L 21/332* (2006.01)
*H01L 21/8238* (2006.01)
*H01L 21/8234* (2006.01)

(52) U.S. Cl. .................. 438/138; 438/212; 438/237; 438/238

(58) Field of Classification Search .................. None
See application file for complete search history.

(56) References Cited

U.S. PATENT DOCUMENTS

| | | | |
|---|---|---|---|
| 4,794,441 A | 12/1988 | Sugawara et al. | |
| 5,030,829 A * | 7/1991 | Plies et al. | 250/358.1 |
| 5,159,518 A * | 10/1992 | Roy | 361/56 |
| 5,173,754 A | 12/1992 | Manning | |
| 5,214,295 A | 5/1993 | Manning | |
| 5,286,663 A | 2/1994 | Manning | |
| 5,329,142 A | 7/1994 | Kitagawa et al. | |
| 5,486,717 A | 1/1996 | Kokubo et al. | |
| 5,497,011 A | 3/1996 | Terashima | |
| 5,535,156 A | 7/1996 | Levy et al. | |
| 5,541,547 A * | 7/1996 | Lam | 327/355 |
| 5,581,104 A | 12/1996 | Lowrey et al. | |
| 5,594,683 A | 1/1997 | Chen et al. | |
| 5,611,053 A * | 3/1997 | Wu et al. | 710/100 |
| 5,621,742 A * | 4/1997 | Yoshino | 714/745 |
| 5,624,863 A | 4/1997 | Helm et al. | |
| 5,650,350 A | 7/1997 | Dennison et al. | |
| 5,682,483 A * | 10/1997 | Wu et al. | 710/300 |
| 5,705,843 A | 1/1998 | Roberts | |
| 5,710,741 A | 1/1998 | McLaury | |
| 5,736,777 A * | 4/1998 | Shield et al. | 257/529 |
| 5,776,823 A | 7/1998 | Agnelio et al. | |
| 5,910,664 A * | 6/1999 | Ajit | 257/212 |
| 5,973,356 A | 10/1999 | Noble et al. | |
| 6,064,093 A * | 5/2000 | Ohta | 257/355 |
| 6,104,045 A * | 8/2000 | Forbes et al. | 257/141 |
| 6,128,216 A * | 10/2000 | Noble et al. | 365/154 |
| 2001/0021122 A1 | 9/2001 | Kurth et al. | |

OTHER PUBLICATIONS

Dermot MacSweeney et al., "Modeling of Lateral Bipolar Devices In a CMOS," IEEE BCTM 1.4, 4 pages.

(Continued)

*Primary Examiner*—David E. Graybill
(74) *Attorney, Agent, or Firm*—Dickstein Shapiro LLP

(57) ABSTRACT

High density static memory cells and arrays containing gated lateral bipolar transistors which can be latched in a bistable on state. Each transistor memory cell includes two gates which are pulse biased during the write operation to latch the cell. Also provided is a CMOS fabrication process to create the cells and arrays.

6 Claims, 14 Drawing Sheets

OTHER PUBLICATIONS

J.J. Ebers, "Four-Terminal P-N-P-N Transistors," Proceedings of IRE, Nov. 1952, p. 1361-4.

I.T. Ho et al, "Single Thyristor Static Memory and Its Fabrication," vol. 23, No. 3, 1980.

B.L. Gregory et al, "Latchup in CMOS Integrated Circuits," Sandia Laboratories, p. 12-18.

S. M. Sze, "Physics of Semiconductor Devices," Second Edition, pp. 201-212, A Wiley Interscience 1981 Pub.

S.D. Malaviya, "Single-Device DC Stable Memory Cell," IBM Technical Disclosure Bulletin, vol. 20, No. 9, pp. 3492-3494, Nov. 1978.

R.C. Fang, "Latchup Model for the Parasitic P-N-P-N Path In Bulk CMOS," IEEE Transactions on Electron Devices, vol. Ed. 31, No. 1, Jan. 1984.

R. R. Troutman et al, "Transient Analysis of Latchup In Bulk CMOS," IEEE Transactions on Electron Devices, vol. Ed. 30, No. 2, Feb. 1993.

D. L. Hetherington et al., "An Integrated GaAs N-P-N-P Thyristor/JFET Memory Cell Exhibiting Nondestructive Read," IEEE Electron Device Letters, vol. 13, No. 9, Sep. 1992.

S.V. Vandebroek et al., "High-Gain Lateral Bipolar Action in a MOSFET Structure," IEEE Transactions on Electron Devices, vol. 38, No. 11, Nov. 1991.

Farid Nemati et al, "A Novel High Density, Low Voltage SRAM Cell With A Vertical NDR Device," Center for Integrated Systems, Standford University, Stanford, CA, (2 pages), 1998, IEEE.

Hyun-Jin Cho et al., "A Novel Pillar DRAM Cell for 4GBIT and Beyond," Center for Integrated Systems, Stanford University, Stanford, CA, (2 pages), 1998, IEEE.

* cited by examiner

HIGH DENSITY SRAM CELL WITH LATCHED VERTICAL TRANSISTORS

CROSS REFERENCE TO RELATED APPLICATIONS

This application is a divisional of application, Ser. No. 09/750,111, filed Dec. 29, 2000 now U.S. Pat. No. 6,936,886, which is a divisional of application, Ser. No. 09/076,728, filed May 13, 1998, U.S. Pat. No. 6,225,165, issued May 1, 2001, of which the entirety of each is incorporated herein by reference.

FIELD OF THE INVENTION

This invention relates generally to non-volatile static memory devices. Particularly, this invention relates to a high density Static Random-Access Memory (SRAM) cell taking advantage of the latch-up phenomenon in a Complementary Metal Oxide Semiconductor (CMOS).

BACKGROUND OF THE INVENTION

One known type of static read/write memory cell is a high-density static random access memory (SRAM). A static memory cell is characterized by operation in one of two mutually-exclusive and self-maintaining operating states. Each operating state defines one of the two possible binary bit values, zero or one. A static memory cell typically has an output which reflects the operating state of the memory cell. Such an output produces a "high" voltage to indicate a "set" operating state. The memory cell output produces a "low" voltage to indicate a "reset" operating state. A low or reset output voltage usually represents a binary value of zero, while a high or set output voltage represents a binary value of one.

A static memory cell is said to be bistable because it has two stable or self-maintaining operating states, corresponding to two different output voltages. Without external stimuli, a static memory cell will operate continuously in a single one of its two operating states. It has internal feedback to maintain a stable output voltage, corresponding to the operating state of the memory cell, as long as the memory cell receives power.

The operation of a static memory cell is in contrast to other types of memory cells such as dynamic cells which do not have stable operating states. A dynamic memory cell can be programmed to store a voltage which represents one of two binary values, but requires periodic reprogramming or "refreshing" to maintain this voltage for more than very short time periods.

A dynamic memory cell has no internal feedback to maintain a stable output voltage. Without refreshing, the output of a dynamic memory cell will drift toward intermediate or indeterminate voltages, resulting in loss of data. Dynamic memory cells are used in spite of this limitation because of the significantly greater packaging densities which can be attained. For instance, a dynamic memory cell can be fabricated with a single MOSFET transistor, rather than the six transistors typically required in a static memory cell.

One of the limitations of static memory cells utilizing both n-channel and p-channel devices (CMOS SRAMS) is their exceptionally large cell areas, typically over $100F^2$, where F is the minimum feature size. Even using only n-channel devices, cell size in a compact SRAM design is over $50F^2$. See U.S. Pat. No. 5,486,717. The result is much lower densities than for DRAMs, where the cell size is only 6 or $8F^2$.

Conventional CMOS SRAM cells essentially consist of a pair of cross-coupled inverters as the storage flip-flop or latch, and a pair of pass transistors as the access devices for data transfer into and out of the cell. Thus, a total of six Metal Oxide Semiconductor Field Effect Transistors (MOSFETs), or four MOSFETs plus two very high resistance load devices, are required for implementing a conventional CMOS SRAM cell.

To achieve higher packing densities, several methods are known for reducing the number of devices needed for CMOS SRAM cell implementation, or the number of the devices needed for performing the Read and Write operations. However, increased process complexity, extra masks, and high fabrication cost are required and the corresponding product yield is not high.

For example, K. Sakui, et al., "A new static memory cell based on reverse base current (RBC) effect of bipolar transistor," *IEEE IEDM Tech. Dig.*, pp. 44–47, December 1988), refers to a Bipolar-CMOS (BICMOS) process in which only two devices are needed for a SRAM cell: one vertical bipolar transistor, and one MOSFET as a pass device. Extra processing steps and increased masks are required, along with special deep isolation techniques, resulting in high fabrication cost and process complexity. Yield of SRAM products utilizing such complex processes is usually low compared with the existing CMOS processes.

A problem with CMOS circuits in general is their propensity to "latchup." Latchup is a phenomenon that establishes a very low-resistance path between the $V_{DD}$ and $V_{SS}$ power lines, allowing large currents to flow through the circuit. This can cause the circuit to cease functioning, or even to destroy itself due to heat damage caused by high power dissipation.

The susceptibility to latchup arises from the presence of complementary parasitic bipolar transistor structures, which result from the fabrication of the complementary MOS devices in CMOS structures. Since they are in close proximity to one another, the complementary bipolar structures can interact electrically to form device structures which behave like p-n-p-n diodes. In the absence of triggering currents, such diodes act as reverse-biased junctions and do not conduct. Such triggering currents, however, may be and in practice are established in any one or more of a variety of ways, e.g., terminal overvoltage stress, transient displacement currents, ionizing radiation, or impact ionization by hot electrons.

Gregory, B. L., et al., "Latchup in CMOS integrated circuits," *IEEE Trans. Nucl. Sci. (USA)*, Vol. 20, no. 6, p. 293–9, proposes several techniques designed to eliminate latchup in future CMOS applications. Other authors, such as Fang, R. C., et al., "Latchup model for the parasitic p-n-p-n path in bulk CMOS," *IEEE Transactions on Electron Devices*, Vol. ED-31, no. 1, pp. 113–20, provide models of the latchup phenomenon in CMOS circuits in an effort to facilitate design optimizations avoiding latchup.

The present invention takes advantage of the normally undesirable latchup phenomenon in CMOS circuits to construct a compact static memory cell.

SUMMARY OF THE INVENTION

The present invention provides area efficient static memory cells and memory arrays by the use of lateral bipolar transistors which can be latched in a bistable on state with small area transistors. Each lateral bipolar transistor memory cell includes two gates which are pulse biased during the write operation to latch the cell. These cells can be realized utilizing CMOS technology to create vertical structures in trenches with a minimum of masking steps and minimal process complexity.

DETAILED DESCRIPTION OF THE PREFERRED EMBODIMENT

In the following detailed description, reference is made to the accompanying drawings which form a part hereof, and in which is shown by way of illustration specific embodiments in which the invention may be practiced. These embodiments are described in sufficient detail to enable those skilled in the art to practice the invention, and it is to be understood that other embodiments may be utilized and that structural, logical and electrical changes may be made without departing from the spirit and scope of the present invention.

The terms wafer or substrate used in the following description include any semiconductor-based structure having an exposed silicon surface in which to form the structure of this invention. Wafer and substrate are to be understood as including doped and undoped semiconductors, epitaxial layers of silicon supported by a base semiconductor foundation, and other semiconductor structures. Furthermore, when reference is made to a wafer or substrate in the following description, previous process steps may have been utilized to form regions/junctions in the base semiconductor structure or foundation. The following detailed description is, therefore, not to be taken in a limiting sense, and the scope of the present invention is defined by the appended claims.

Figure 1:
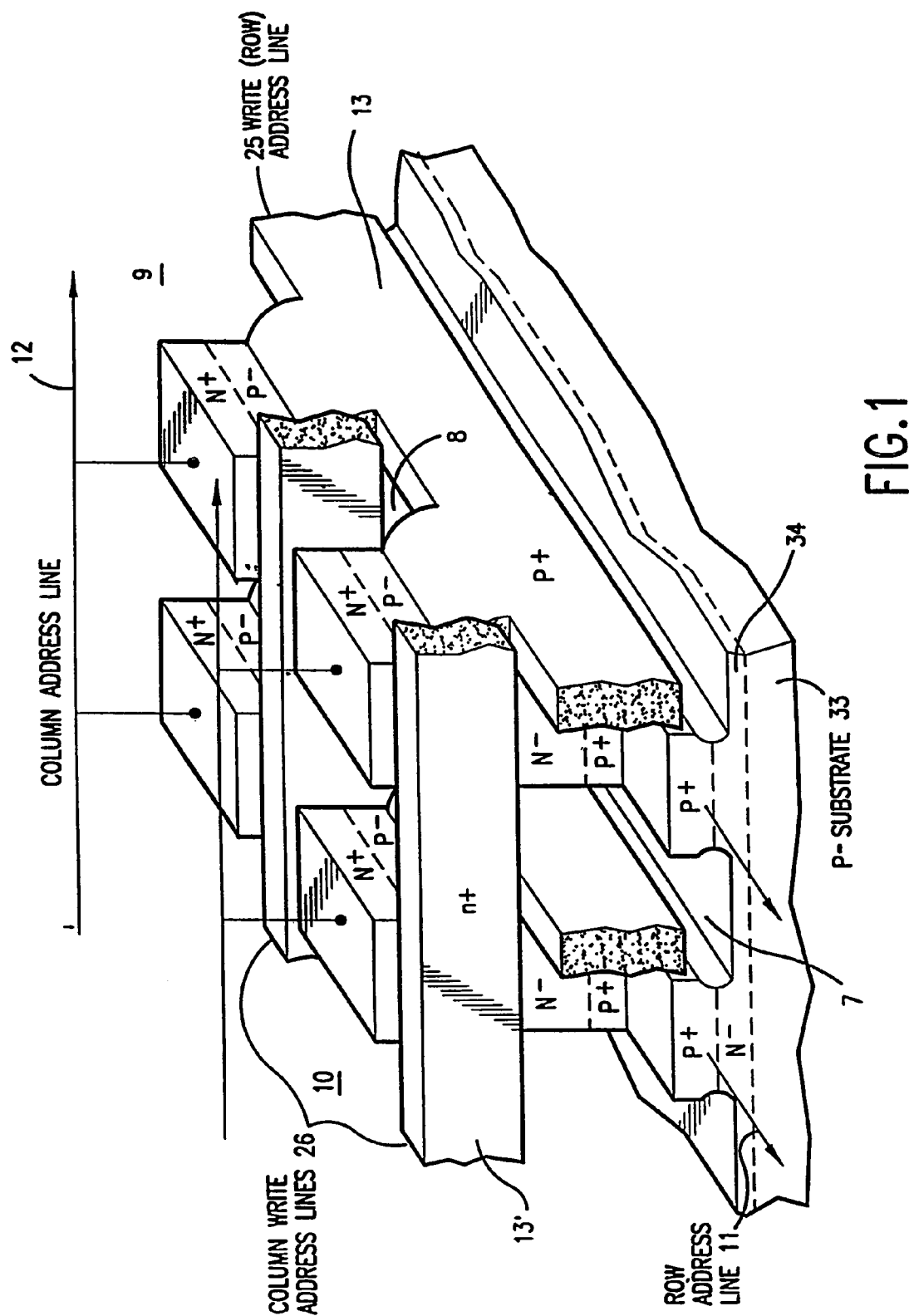
FIG. 1 illustrates one embodiment of a SRAM cell array with latch-up and gated lateral bipolar transistors according to the present invention.

Referring now to the drawings, where like elements are designated by like reference numerals, an embodiment of the SRAM device array 9 of the present invention is shown in FIG. 1. The array 9 is comprised of a plurality of merged vertical bipolar transistors on n-type layer 34 on p-type silicon substrate 33. Merged vertical transistor devices, noted generally 10, are separated from each other by isolation trenches 7, 8. Each merged transistor device 10 has dimensions of one F by one F, and each isolation trench 7, 8 is preferably one F wide. Thus, with the inclusion of transistor to transistor isolation, the area per programmed device cell is $4F^2$ (2F×2F).

Figure 2A:
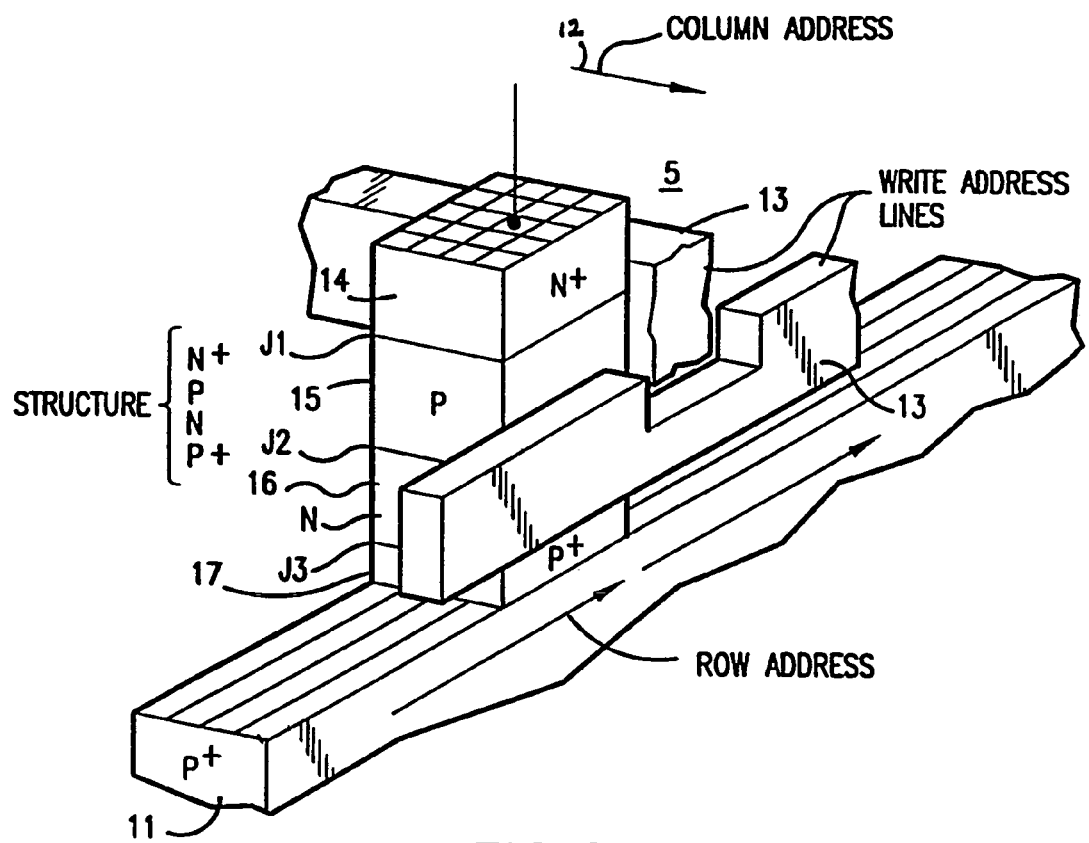
FIG. 2 depicts a SRAM cell with latch-up and two gated lateral bipolar transistors.
Figure 2B:
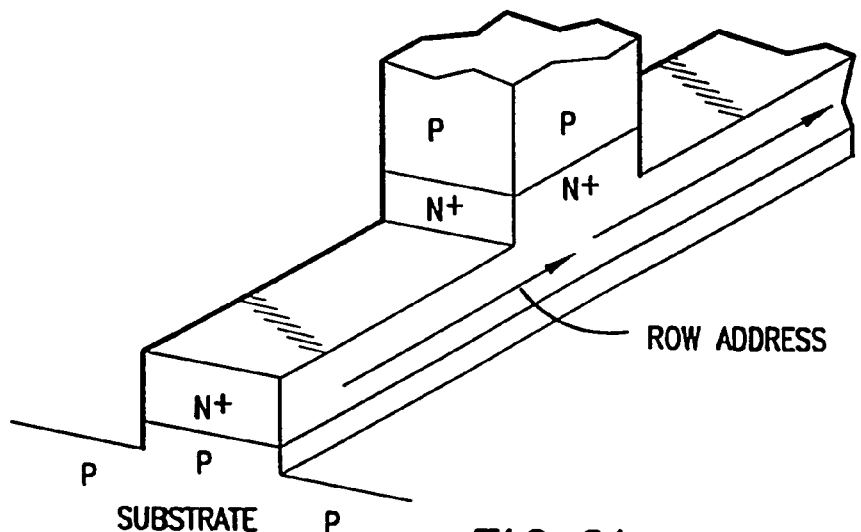
Figure 3A:
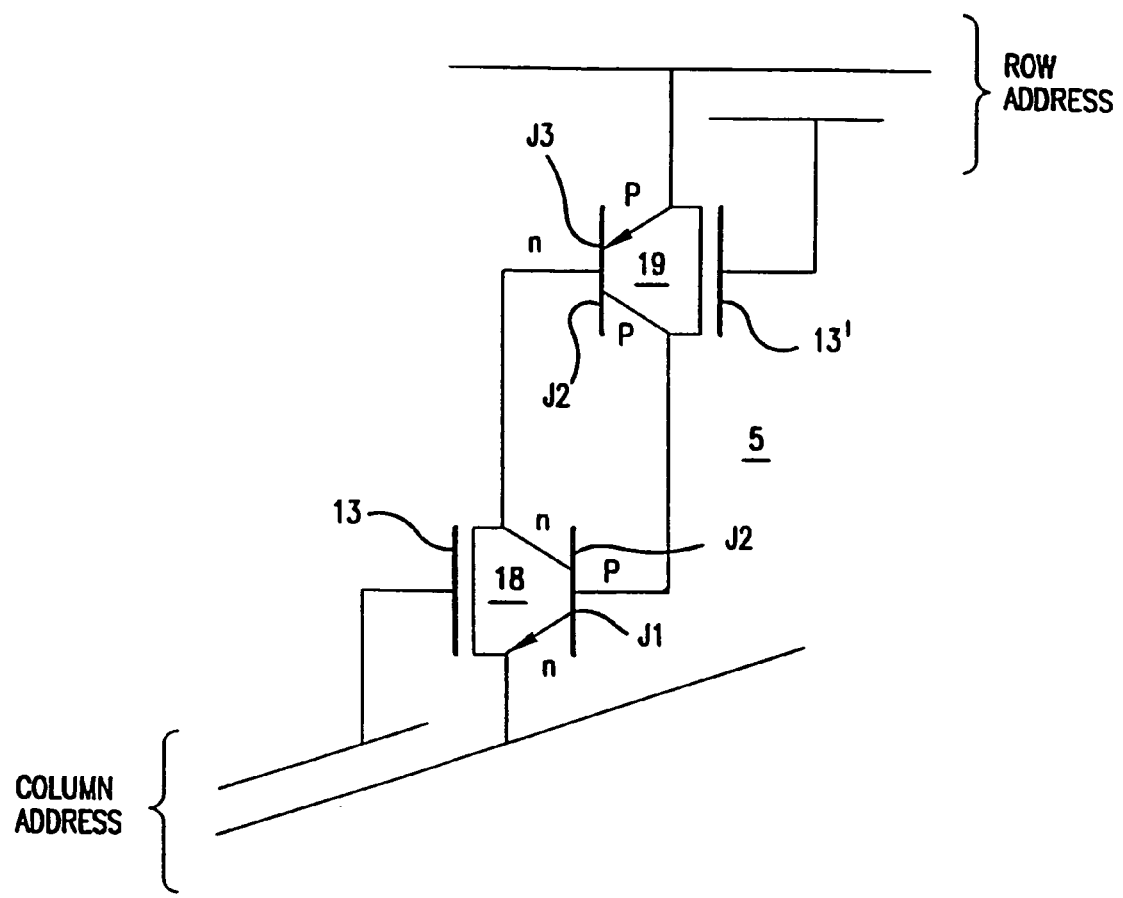
FIG. 3 depicts circuit diagrams for the SRAM cell of FIG. 2.
Figure 7:
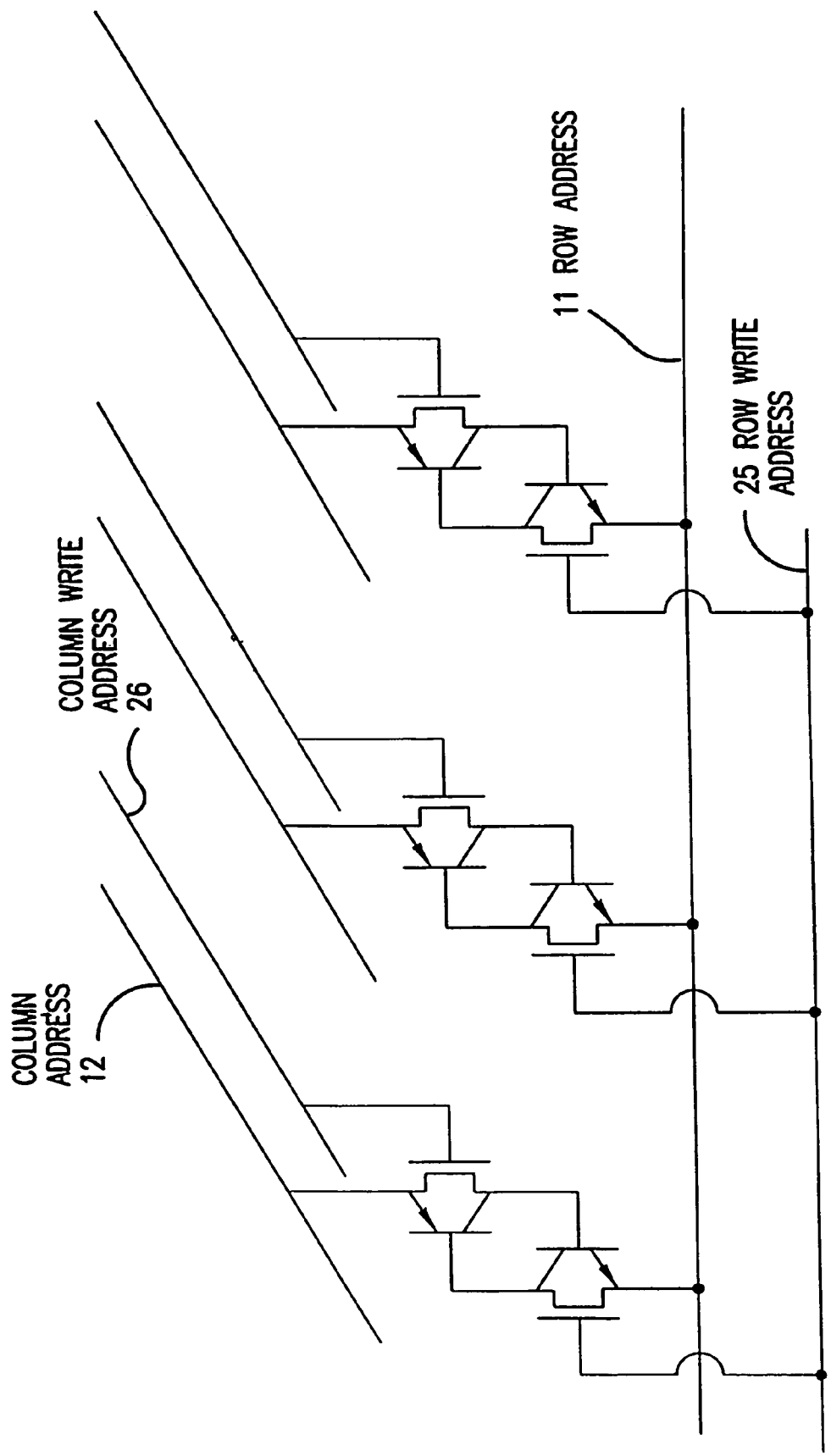
FIG. 7 illustrates a SRAM cell array with interconnect circuitry.

Referring to FIG. 2, a static memory cell, generally designated 5, comprises two complementary bipolar transistors which can latch-up, normally an undesirable characteristic in CMOS but utilized here to construct a compact SRAM cell. As shown in FIGS. 2 and 3, p+ region 17, n-region 16, and p-region 15 comprise a p-n-p bipolar transistor 19; and n+ region 14, p-region 15, and n-region 16 comprise an n-p-n bipolar transistor 18. Thus, each merged bipolar transistor device 10 can be considered as a p-n-p transistor 19 and an n-p-n transistor 18 connected with the collector of one transistor attached to the base of the other, and vice versa, as shown in FIGS. 3(a) and 7. The center junction (J2) acts as a collector of electrons from (J1) and of holes from (J3). In equilibrium, there is at each junction a depletion region with a built-in potential determined by the impurity doping profile. When a positive voltage is applied to the anode, junction (J2) will become reverse-biased, while (J1) and (J3) will be forward biased.

There are four sets of interconnects in the device array 9. Row address line 11 is in connection with lowermost p+ region 17 of each transistor device 10. Column address line 12 is in connection with the uppermost n+ region 14. Write row address line 25 is in connection with p+ polysilicon gate 13, and column write address line 26 is in connection with n+ polysilicon gate 13'. A high density array is achieved by the use of vertical devices and by placing gates 13 and 13' in isolation trenches 7 and 8, respectively. Gate 13 is in contact with the central n-region of each bipolar transistor 18, and gate 13' is in connection with the central p-region of each bipolar transistor 19, as shown in FIGS. 1 and 2(a). Gates 13 and 13' run within isolation trenches 7 and 8 on one side of each gated lateral bipolar transistor device 10.

Figure 3B:
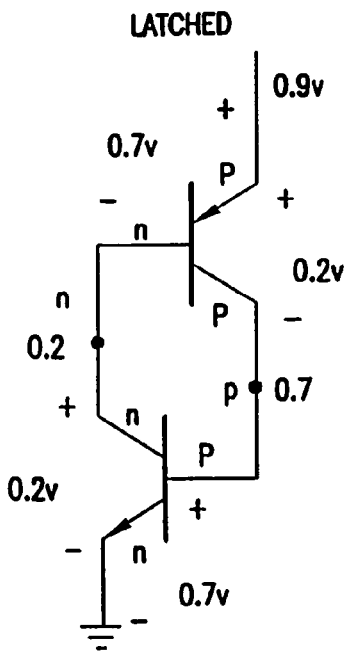
Figure 3C:
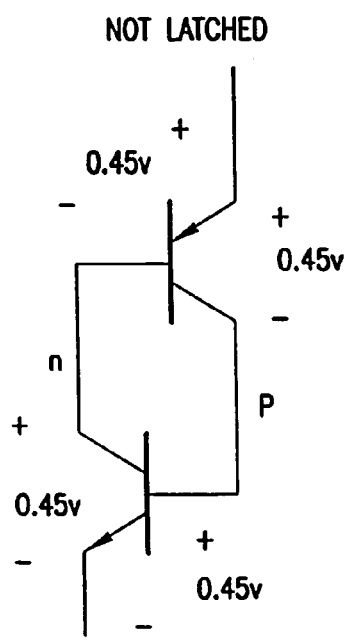

Referring to FIG. 3, showing static memory cell 5, containing gates 13 and 13', FIG. 3(b) shows memory cell 5 in the latched condition. FIG 3(c) shows memory cell 5 in the blocking (not latched) condition. These conditions reflect CMOS latch-up action, initiated by gate voltage from gates 13 and 13'. Gates 13 and 13' induce latch-up in the gated lateral bipolar transistor device 10, thus creating one of the two bistable states for the static memory cell, as discussed in detail below.

Figure 4:
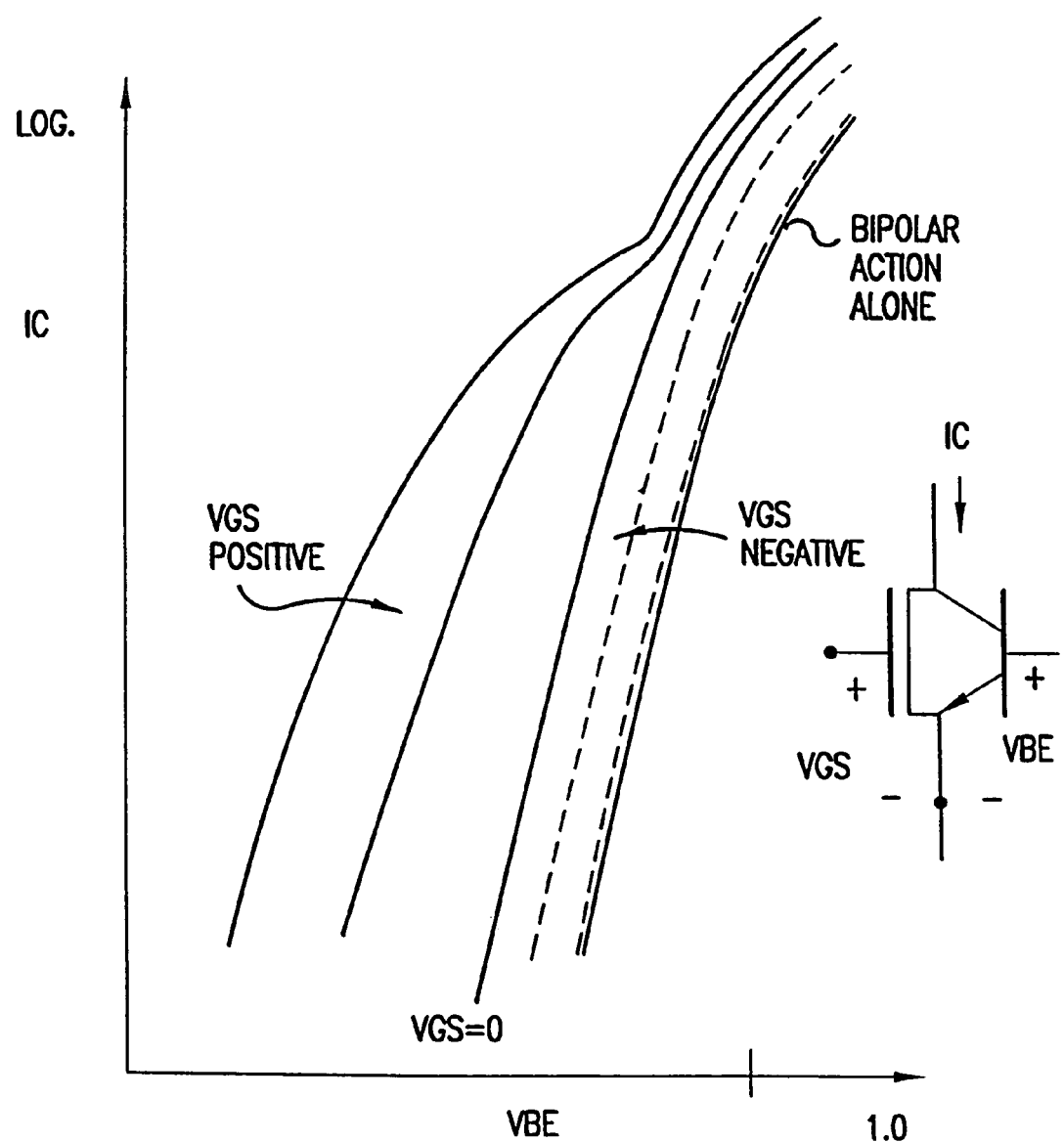
FIG. 4 illustrates current-voltage characteristics in the gated lateral bipolar transistor structure of the SRAM cell of FIG. 2.
Figure 5:
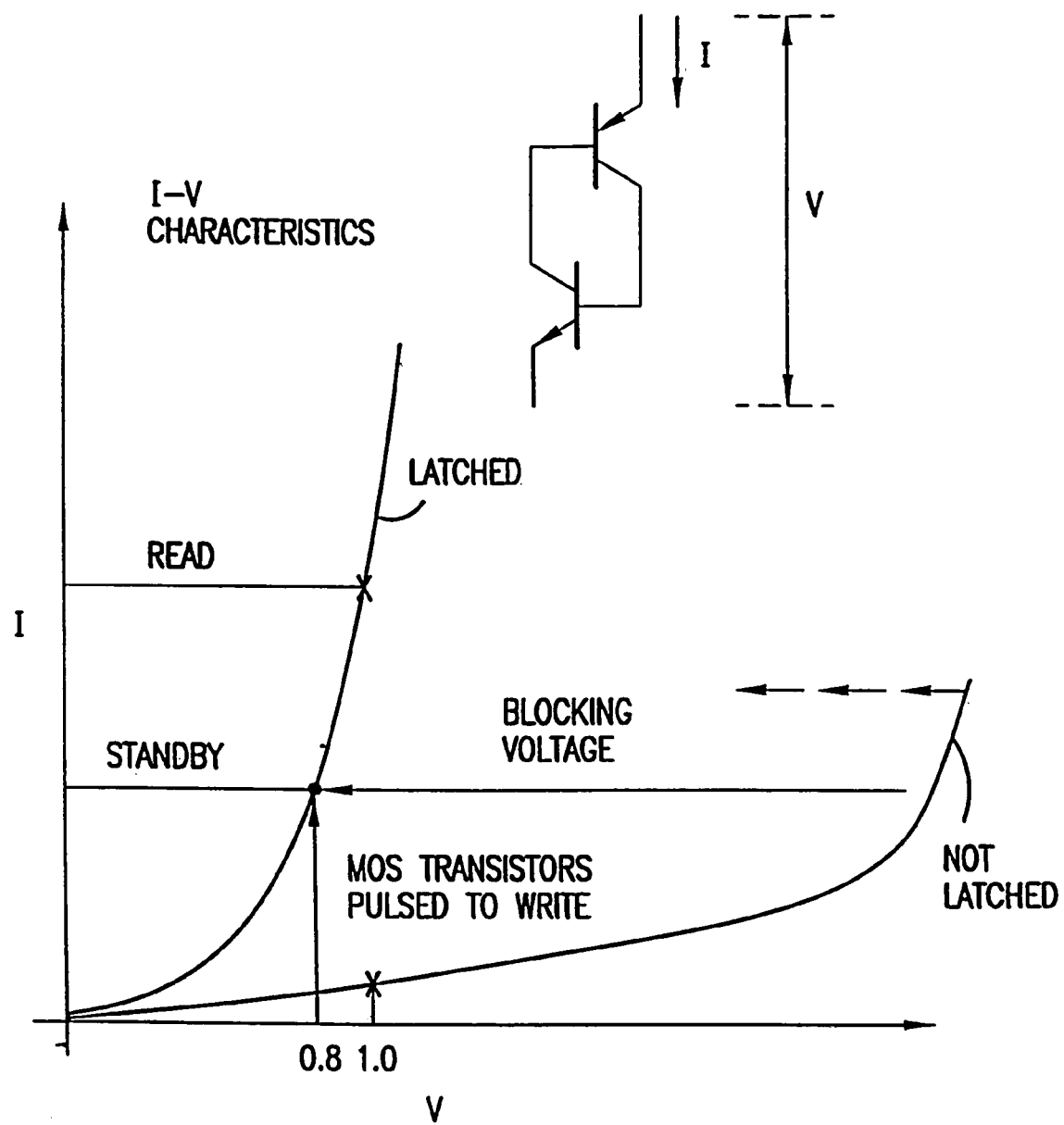
FIG. 5 depicts the blocking, write and latchup states of the SRAM cell of FIG. 2.

FIGS. 4 and 5 illustrate-gated lateral bipolar transistor characteristics and operation of the static memory cell. As shown in FIG. 4, collector current ($I_C$) is a function of base emitter voltage ($V_{BE}$) and gate voltage, VGS positive and VGS negative. Referring to FIG. 5, if bipolar transistors 18, 19 are biased off, then the cell will block and not become latched until the power supply voltage, $V_{DD}$, is increased to about 1.2 to 1.4 volts. However, the cell can be induced to latch-up at low power supply voltages of about 0.9 volts by the application of pulsed gate bias.

Figure 6:
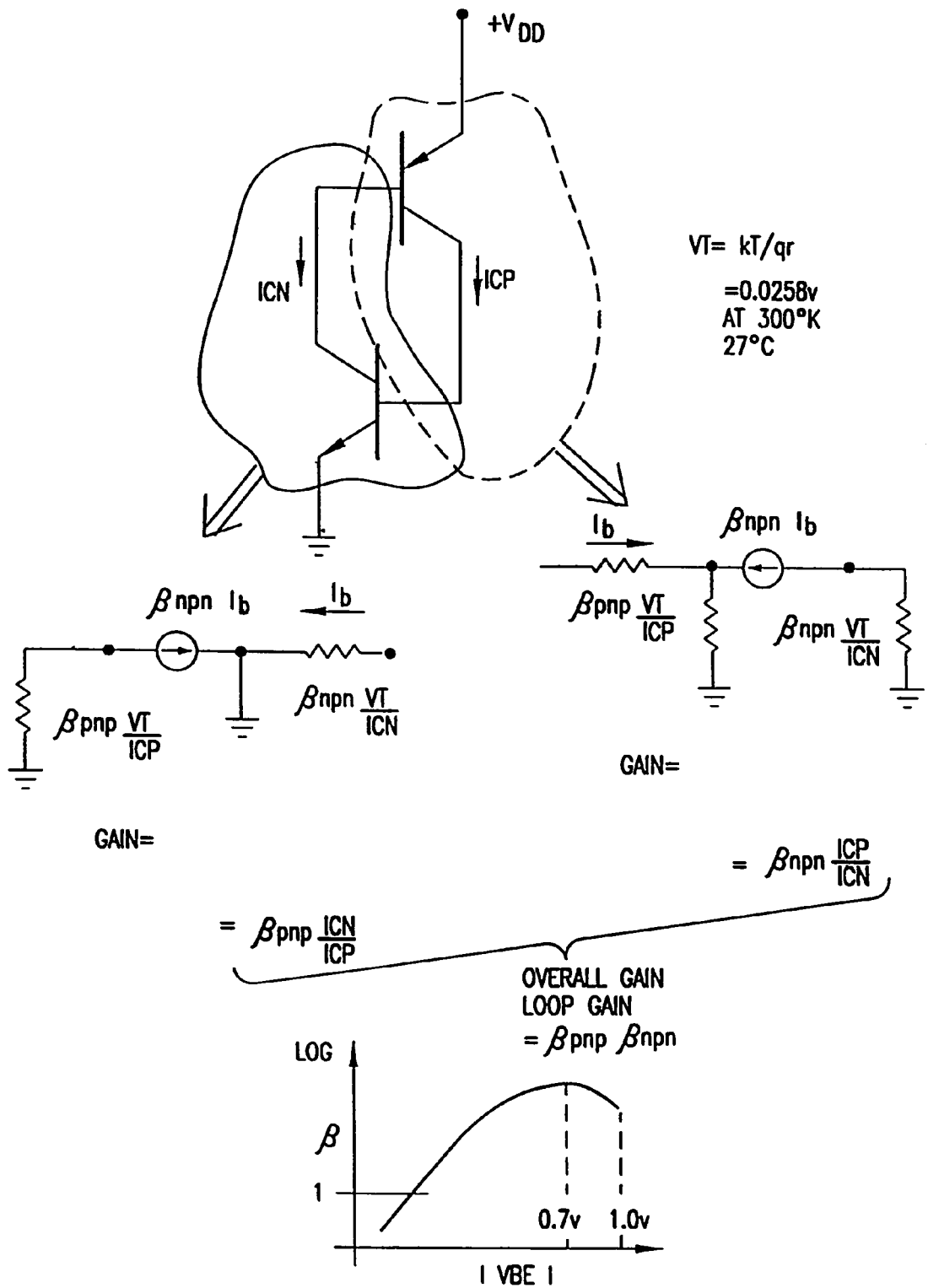
FIG. 6 depicts circuit diagrams for the SRAM cell of FIG. 2.

FIG. 6 shows the latch-up condition in these CMOS circuits. Lateral bipolar transistors will not latch-up if the gate voltage is zero or negative for n-channel devices and the drain voltage is low. In order for the circuit to latch-up, the loop gain must be greater than one. The open loop gain is the product of the transistor current gains or "beta" values. At low bias conditions, and low base emitter voltages ($V_{BE}$), the currents will be low and the bipolar transistors will have a low current gain which can be less than one. As base emitter voltages ($V_{BE}$) are increased, then collector currents ($I_C$) increase, "beta" will increase and the circuit will latch-up when the individual base emitter voltages ($V_{BE}$) approach about 0.6 to 0.7 volts, or the total power supply voltage is 1.2 to 1.4 volts. At low power supply voltages, the circuit will not latch-up unless there is some other stimulus. In the memory cell of the present invention, the stimulus to promote latch-up at low power supply voltages like 0.9 volts is the gate bias, which decreases the collector-emitter voltages to 0.2V or less on one transistor causing the base-emitter junctions on the other transistor to become strongly forward biased. The circuit will then become latched.

The cell can be latched when it is in a low voltage, $V_{DD}$=0.9V, state by strongly turning on both gates of the MOS transistors causing these transistors to go into the linear region of operation with a low drain to source voltage. Most of the power supply voltage will appear across the base emitter junctions of the bipolar transistors. It is necessary to turn on both MOS transistors to latch-up the cell, so a coincidence in the address is required during the write cycle. The gates must be pulsed sequentially; first the charge is built up in one base region and then the other transistor is immediately pulsed to build up charge in the other base region before it decays in the first. Once latched, the cell will stay turned on. The bias applied to induce latch-up is "pulsed" in the sense that it is only applied to initiate latchup. The cell is stable in the latched condition as a result of the pulse initiated latch-up, which occurs during the "write" operation.

An alternative description of the turn-on of these four layer device structures can be given by the consideration of p-n-p-n thyristors. At low currents the center n-p junction (J2) is reverse biased and blocking. To get the device to turn on, it is necessary to introduce some external stimulus, in this case base current by virtue of turning on the MOS transistors with a pulsed gate bias. Both gates must be pulsed to get enough current such that the product of the current gains exceeds one. Pulsing only one gate will leave one bipolar transistor with a very low current gain, which will not be sufficient to cause regeneration.

Current during the standby latch-up condition can be estimated from consideration of the collector and base current of a gated lateral bipolar transistor as a function of base emitter voltage ($V_{BE}$). We have shown that as a result of "beta" varying with bias, a current gain of one or more is achieved for sub-nanoampere currents. Standby current can be in the nanoampere range. This occurs at bias voltages of about 0.45V.

Referring now to FIG. 7, the array structure of the CMOS SRAM includes row address line 11 and row write address line 25, column address line 12 and column write address line 26. Data can be read most conveniently by addressing a row and a column and increasing the power supply voltage to 0.9V or more at the coincidence of the address. If the cell is latched up, a large current will be sensed between these row and column lines. If not latched, there will be little extra current. When the cell is not addressed, it can be left in some low voltage state with $V_{DD}$ around 0.7V to 0.8V to reduce power consumption.

Write can be accomplished by a coincidence of address in the MOS transistor polysilicon gate lines 13 and 13' which turns the transistors on strongly. Writing "one" or turning the transistors on and latching up the cell can be achieved even when the cell is in a low $V_{DD}$ voltage standby state.

It is most convenient to "write" a row or word as one operation. To do so, the row voltage comes positive to leave some very low value like 0.4V or less across transistors in the row to turn off any transistors which are latched up, thus writing "zero" in all cells along the row or word line. Sufficient time is then allowed for any excess base charge in the latched cells to recombine. Following this, "ones" are written into selected locations along the word line by a coincidence of polysilicon gate line addresses.

Figure 8:
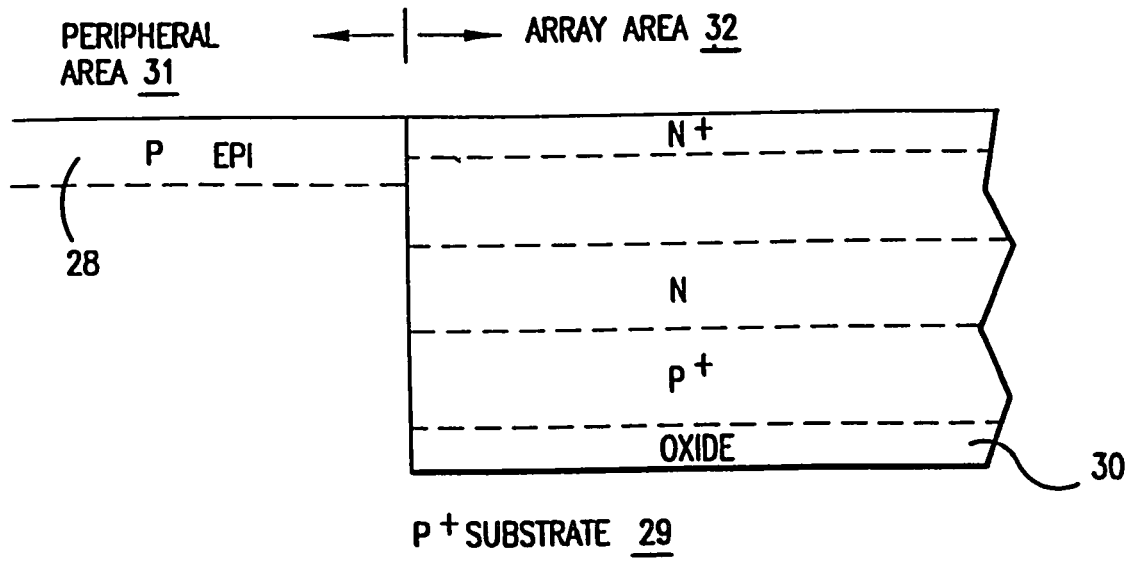
FIG. 8 shows an in-process wafer for producing a SRAM cell array using oxide isolation on a p+ substrate.
Figure 9:
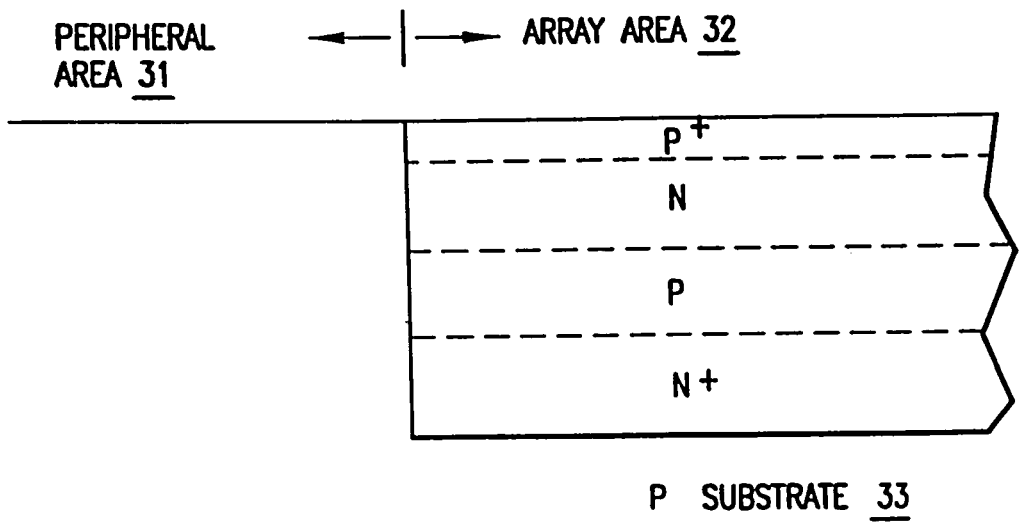
FIG. 9 shows an in-process wafer for producing a SRAM cell array using a dopant (diffusion) or junction isolated inverted structure on a p-type substrate.
Figure 10:
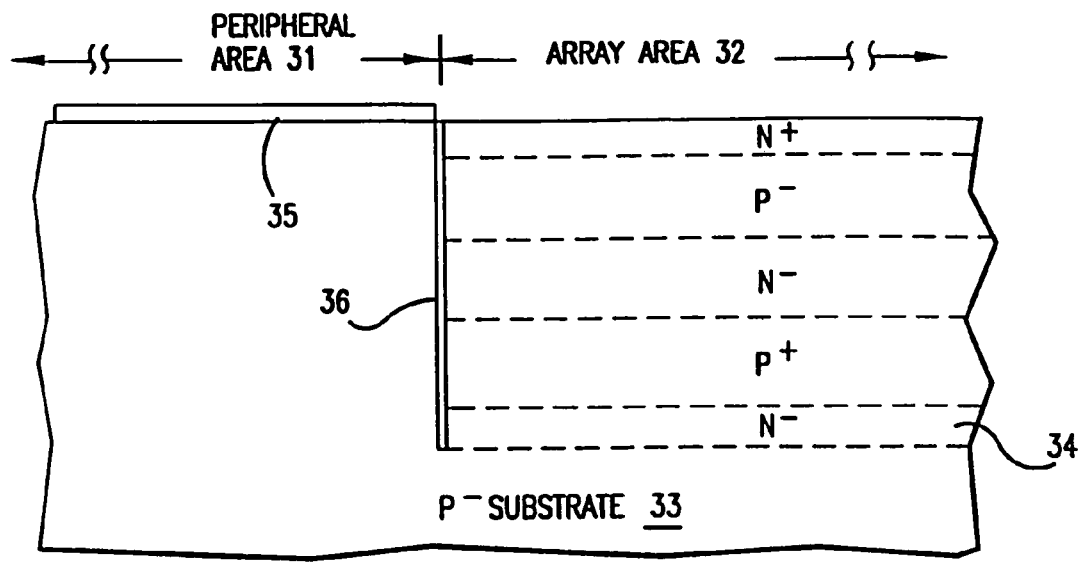
FIG. 10 shows an in-process wafer for producing a non-inverted SRAM cell array using an additional n-type layer to achieve isolation on a p-type substrate.

If planar CMOS peripheral circuits are used, the substrate array and peripheral circuit doping profiles must be separated. The exact realization depends on the type of substrate to be used and the technology used to isolate the array structures from the substrate. FIG. 8 illustrates peripheral area 31, array area 32, epitaxial p-layers 28 (EPI) on p+ substrate 29, and oxide isolation layer 30 undercutting the p+ columns in the array area. FIGS. 9 and 2(b) illustrate the use of a p-type substrate 33 and inversion of the array structure to achieve junction isolation. FIG. 10 illustrates an array structure which is not inverted, but an additional n-type layer 34 is used to achieve junction isolation on p-type substrate 33. The preferred embodiment described in detail below relates to this latter structure, but the techniques described are also applicable to other structures.

The device array is manufactured through a process described as following, and illustrated by FIGS. 10 through 16 and FIG. 1. First, a silicon substrate 33 is selected as the base for the device array. The silicon substrate 33 may be doped or undoped, but a doped p-type wafer is preferred. Next, an oxide pad layer 35 is grown or deposited on top of the silicon substrate 33 by means of, for example, thermal oxidation of the silicon substrate 33.

A resist (not shown) and mask (not shown) are applied to cover peripheral circuit area 31 and expose array area 32, and photolitographic techniques are used to define the array area 32 to be etched out.

An etchant is then applied to define an array window in the oxide pad 35. After removing the resist, the remaining oxide pad 35 is then used as a mask to directionally etch the silicon substrate 33 to a depth of preferably about 1 μm. Any suitable directional etching process may be used, including, for example, Reactive Ion Etching (RIE), to form an array trench in array area 32 of substrate 33.

An oxide layer 36 is then grown or deposited to cover the bare silicon 33. Oxide layer 36 is then directionally etched to remove oxide from the trench bottom, while leaving oxide layer 36 on the vertical side walls of the array trench. Selective epitaxial silicon is then grown in the array trench in the following preferred doping profile: 0.1 μm n−, 0.3 μm p+, 0.2 μm n−, 0.2 μm p−, 0.2 μm n+, resulting in the cross section as shown in FIG. 10.

Oxide pad 35 is then stripped from the surface of the peripheral area 31. An oxide pad (not shown) of about 10 nm is then grown atop the exposed n+ epitaxial silicon layer in the array area. Next, a nitride pad 37 is formed by depositing a layer of silicon nitride ($Si_3N_4$) ("nitride") by CVD or other means, on top of the pad oxide. The nitride pad 37 is preferably about 60–100 nm thick.

Figure 11:
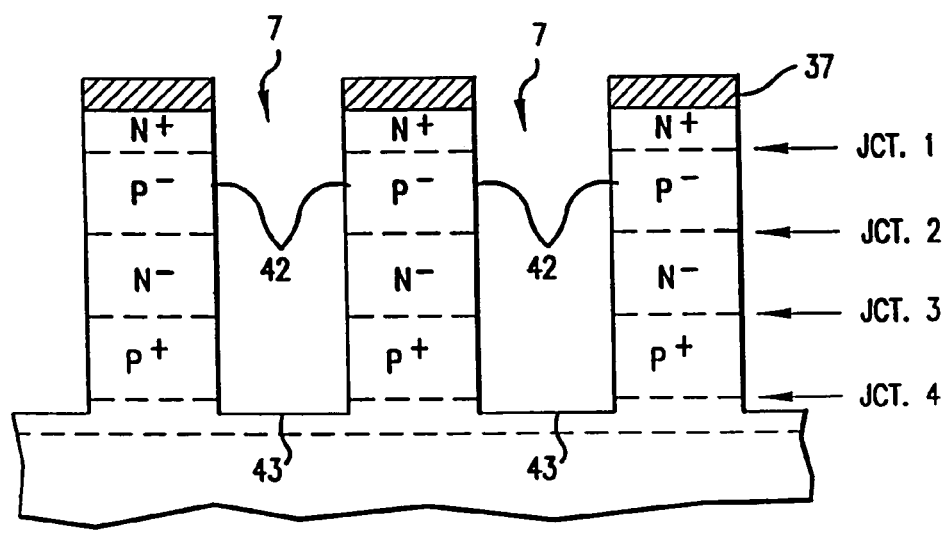
FIG. 11 shows the wafer of FIG. 10 at a processing step subsequent to that shown in FIG. 10.

The next step is to define a first set of trenches 7 of the minimum dimension width and space in the row direction. A resist (not shown) and mask (not shown) are applied, and photolithographic techniques are used to define the area to be etched-out. A directional etching process such as RIE is used to etch through the pad layers 35 and 37 and into the silicon to a depth sufficient to expose the buried n-layer 34 (i.e., below junction 4 (J4)). The resist is then removed. The set of trenches 7 is defined by the sidewalls of the p-n-p-n epitaxial layers, as shown in FIG. 11.

A thin nitride layer (not shown) approximately 10 nm thick is then deposited to cover the sidewalls 42 of trenches 7. The nitride layer is then directionally etched to remove nitride from the trench bottoms, but leaving remaining nitride on the trench sidewalls 42. Thermal oxide is then grown on the trench bottoms 43 to a depth of about 60 to 100 nm, and the thin nitride is then stripped from the sidewalls 42. Next, a thin gate oxide layer 39 is grown on the sidewalls 42 of trenches 7.

A p+ polysilicon layer 41 is then deposited within trenches 7, preferably by CVD. The thickness of the p+ polysilicon layer 41 is preferably less than or equal to about one-third the minimum lithographic dimension.

Figure 12:
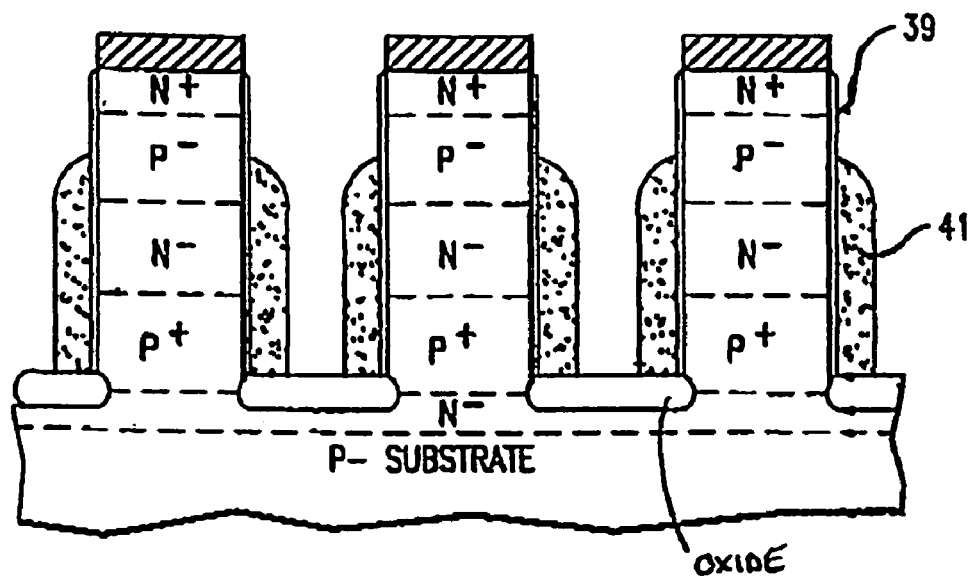
FIG. 12 shows the wafer of FIG. 10 at a processing step subsequent to that shown in FIG. 11.
Figure 13:
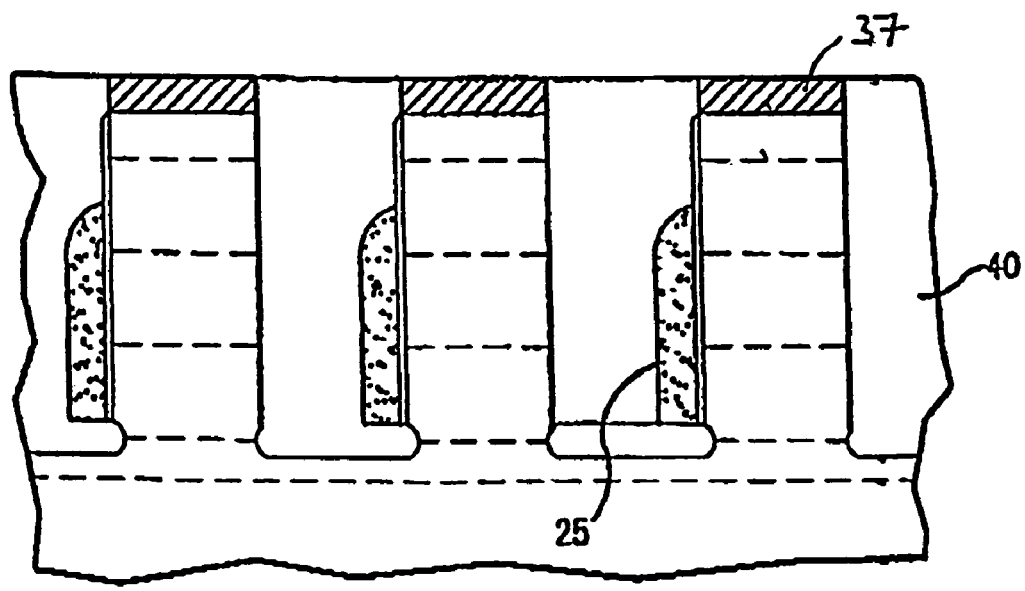
FIG. 13 shows the wafer of FIG. 10 at a processing step subsequent to that shown in FIG. 12.

Referring, now to FIG. 12, the next step is to remove excess polysilicon by directional etching of exposed portions of the polysilicon layer 41 so that the layer remains only on the sidewalls 42 of trenches 7, and is recessed below the level of junction 1 (J1), as shown in FIG. 12. Resist and mask are then applied to cover alternate trench walls. Polysilicon layer 41 is then etched to remove exposed polysilicon and leave remaining polysilicon as row write address lines 25 on one sidewall 42 of each trench 7, as shown in FIG. 13.

Oxide layer 40 is then deposited by CVD to fill the trenches 7. Oxide layer 40 is then planarized by CMP back to the level of nitride pad layer 37, as shown in FIG. 13.

Figure 14:
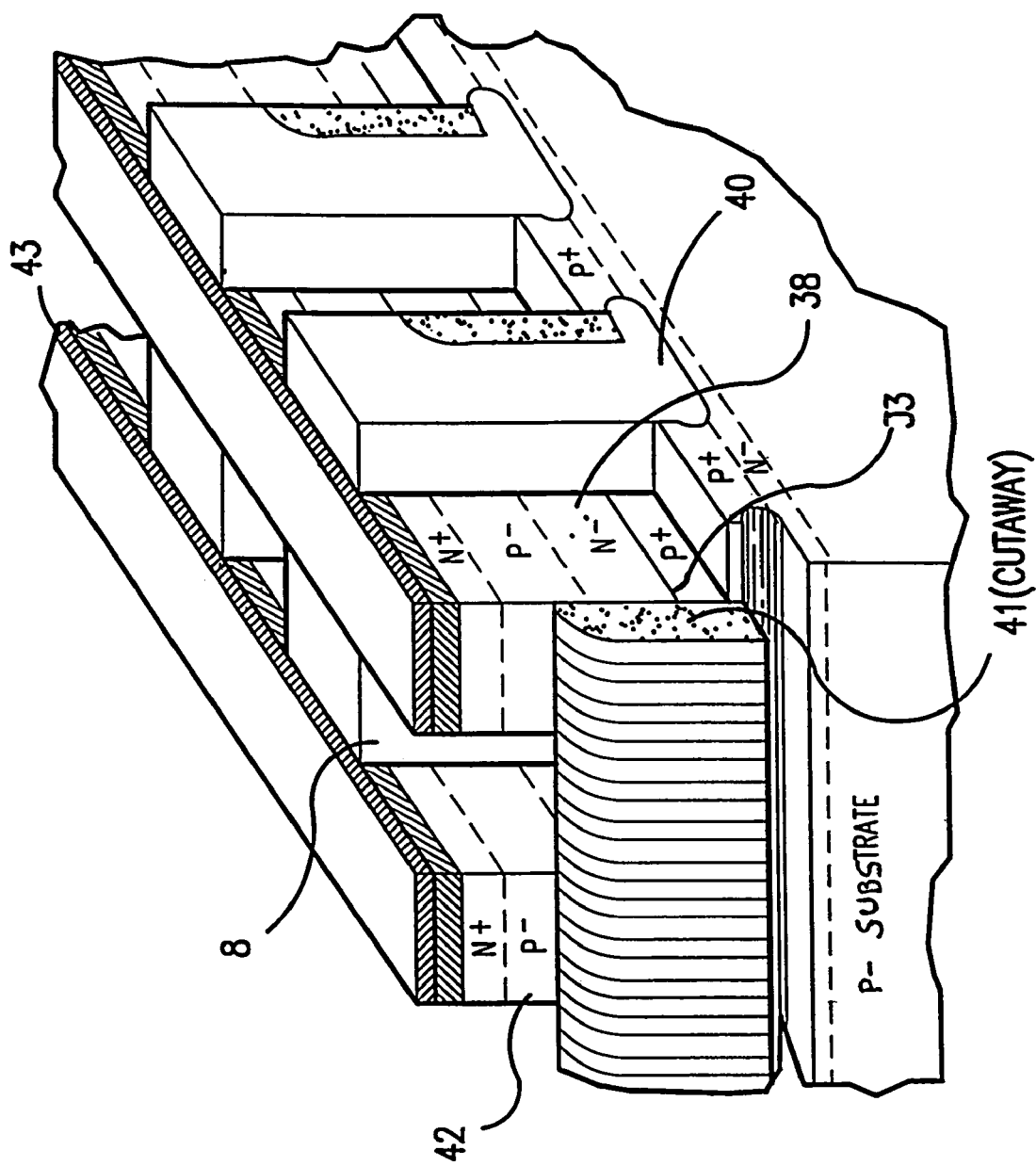
FIG. 14 shows the wafer of FIG. 10 at a processing step subsequent to that shown in FIG. 13.

A second nitride pad layer 43 is then applied, preferably by CVD, to a thickness of about 60 to 100 nm, atop nitride pad layer 37 and oxide layer 40. Photolithography is used to define a second set of trenches 8, orthogonal to the first set of trenches 7. Resist and mask are applied to define the minimum dimension width and space stripes in the column direction. Both nitride pad layers 37 and 43, and the epitaxial layers are etched out by a directional etching process such as RIE to form sidewalls 38 orthogonal to the sidewalls 42 which define the first set of trenches 7. After etching through the nitride pad to expose alternate silicon and oxide regions, a selective silicon etch is used to remove exposed-silicon to sufficient depth to expose the bottom p+ layer as shown in cut-away perspective in FIG. 14. As shown in FIG. 14, etching is continued down to the level of the p+ layer below junction 3 (J3).

Figure 15:
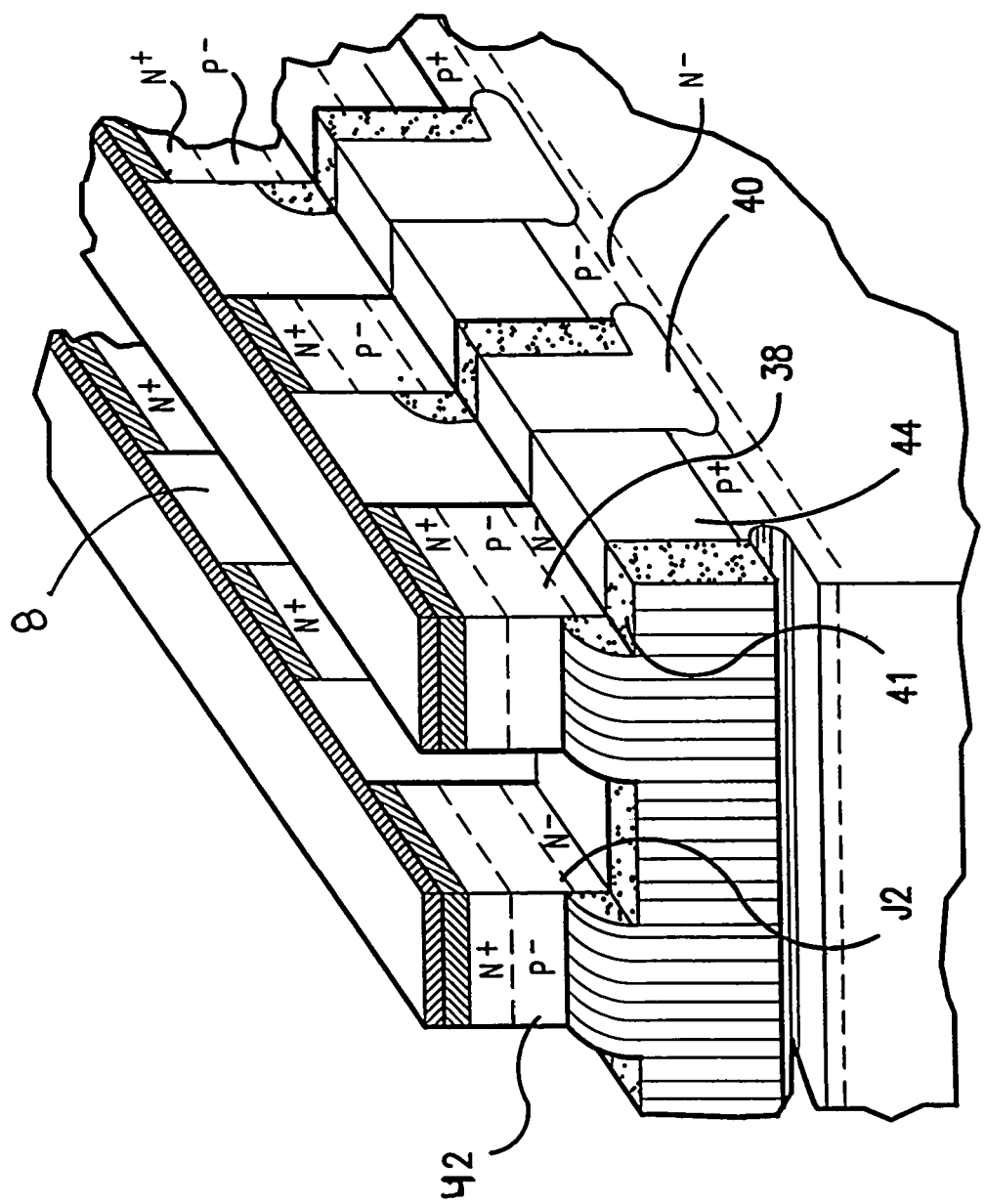
FIG. 15 shows the wafer of FIG. 10 at a processing step subsequent to that shown in FIG. 14.

Next, referring to FIG. 15, oxide layer 44 is deposited by CVD in the second set of trenches 8. Oxide layer 44 is planarized by CMP and then selectively etched to below junction 2 (J2). The exposed polysilicon 41 of row write address line 25 in trenches 8 is then etched to recess below junction 2 (J2), as shown in FIG. 15.

A thin nitride layer (not shown) approximately 10 nm thick is then deposited to cover the sidewalls 38 of trenches 8. The nitride layer is then etched by RIE or other directional etchant to remove nitride from the exposed top of the polysilicon 41, but leaving remaining nitride on the trench sidewalls 38. Thermal oxide (not shown) is then grown to insulate the top of the exposed polysilicon 41 to a depth of about 60 to 100 nm, and the thin nitride is then stripped from the sidewalls 38. Next, a thin gate oxide layer (not shown) is grown on the sidewalls 38 of trenches 8.

An n+ polysilicon layer 45 is then formed in trenches 8 by deposition of doped polysilicon, preferably by CVD. The thickness of the n+ polysilicon layer 45 is preferable less than or equal to about one-third the minimum lithographic dimension.

Figure 16:
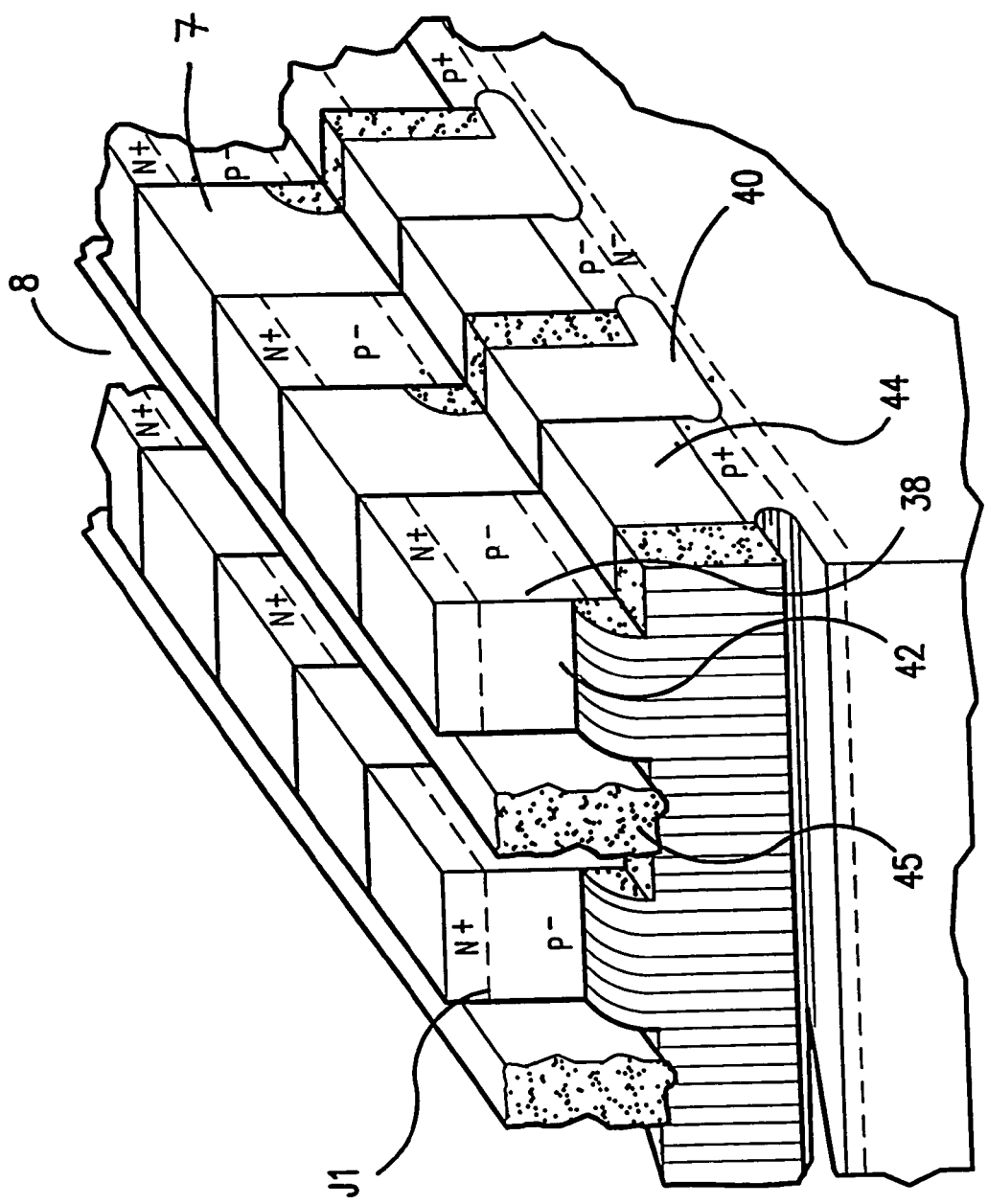
FIG. 16 shows the wafer of FIG. 10 at a processing step subsequent to that shown in FIG. 15.

Referring now to FIG. 16, the next step is to remove excess polysilicon by RIE or other directional etching of polysilicon layer 45 to remove the polysilicon from horizontal surfaces and recess below the level of junction 1 (J1). Resist and mask are then applied to cover alternate trench sidewalls 38 of trenches 8 in the column direction. Polysilicon layer 45 is then etched to remove exposed n+ polysilicon and leave remaining polysilicon as column write address lines 26 on one sidewall of each trench 8 as shown in FIG. 16.

The device array then undergoes a finishing process. Remaining unfilled portions in trenches 8 are filled with silicon oxide and the surface of the device array is planarized, by CVD and CMP, respectively, or other suitable processes. Conventional processing methods may then be used to form contact holes and metal wiring to connect gate lines and to equip the device array for peripheral circuits. The final structure of the device array is as shown in FIG. 1.

The process sequence described and illustrated above provides for the formation of minimum dimension programmable devices. It follows that other structures may also be fabricated, different methods of isolating the bipolar transistors, and different methods of forming the transistors, such as single dopant and implant techniques, may be realized, by process integration with common process steps.

The above description and drawings illustrate preferred embodiments which achieve the objects, features and advantages of the present invention. It is not intended that the present invention be limited to the illustrated embodiments. Any modification of the present invention which comes within the spirit and scope of the following claims should be considered part of the present invention.

What is claimed as new and desired to be protected by Letters Patent of the United States is:

1. A method of storing a binary logic value comprising:
   providing a memory cell, said memory cell comprising a first transistor having a first channel region of a first conductivity type and a second transistor having a second channel region of a second conductivity type, said first and second channel regions being connected with each other;
   providing a first gate spanning said first channel region and a second gate spanning said second channel region;
   sequentially pulsing said first and second gates with a voltage to induce latch-up between said first and second transistors, which stores information in said memory cell as a detectable current state.

2. The method of claim 1 wherein the step of inducing latch-up further comprises application of a voltage to at least one of said first p-type region and said second n-type region.

3. The method of claim 1 wherein said first and second gates are pulsed to approximately one volt.

4. The method of claim 1 wherein after the step of inducing latch-up the voltage at said first and second gates is turned off.

5. The method of claim 1 wherein the step of inducing latch-up further comprises application of a positive voltage.

6. The method of claim 5 wherein said positive voltage is approximately 0.9 volts.

* * * * *

UNITED STATES PATENT AND TRADEMARK OFFICE
CERTIFICATE OF CORRECTION

| | | |
|---|---|---|
| PATENT NO. | : 7,105,386 B2 | Page 1 of 1 |
| APPLICATION NO. | : 10/795516 | |
| DATED | : September 12, 2006 | |
| INVENTOR(S) | : Leonard Forbes et al. | |

It is certified that error appears in the above-identified patent and that said Letters Patent is hereby corrected as shown below:

In the Specification, the following error is corrected:

Column 4, line 52. "FIG. 3(b)" should read --FIG. 2(b)--.

In the Claims, the following error is corrected:

Claim 4, column 8, line 59, "latch-up the" should read --latch-up, the--.

Signed and Sealed this

Second Day of January, 2007

JON W. DUDAS
*Director of the United States Patent and Trademark Office*